United States Patent
Su et al.

(10) Patent No.: US 7,704,886 B2
(45) Date of Patent: Apr. 27, 2010

(54) MULTI-STEP CU SEED LAYER FORMATION FOR IMPROVING SIDEWALL COVERAGE

(75) Inventors: Li-Lin Su, Dongshih (TW); Shing-Chyang Pan, Jhudong (TW); Cheng-Lin Huang, Hsin-Chu (TW); Ching-Hua Hsieh, Hsin-Chu (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 104 days.

(21) Appl. No.: 12/031,280

(22) Filed: Feb. 14, 2008

(65) Prior Publication Data

US 2009/0209098 A1 Aug. 20, 2009

(51) Int. Cl.
*H01L 21/302* (2006.01)
*H01L 21/461* (2006.01)

(52) U.S. Cl. .............. 438/692; 438/680; 438/687; 438/688; 257/E21.17; 257/E21.267; 257/E21.304; 257/E21.006; 257/E21.021

(58) Field of Classification Search .............. 438/692, 438/680, 687, 688, 678, 740, 767, 769
See application file for complete search history.

(56) References Cited

U.S. PATENT DOCUMENTS

| | | | |
|---|---|---|---|
| 6,080,285 A * | 6/2000 | Liu et al. | 204/192.12 |
| 6,217,721 B1 * | 4/2001 | Xu et al. | 204/192.17 |
| 6,582,569 B1 * | 6/2003 | Chiang et al. | 204/192.17 |
| 6,627,542 B1 * | 9/2003 | Gandikota et al. | 438/654 |
| 6,652,718 B1 | 11/2003 | D'Couto et al. | |
| 7,199,052 B2 | 4/2007 | Cohen | |
| 2006/0141157 A1 * | 6/2006 | Sekimoto et al. | 427/282 |

* cited by examiner

*Primary Examiner*—David Nhu
(74) *Attorney, Agent, or Firm*—Slater & Matsil, L.L.P.

(57) ABSTRACT

A method of forming an integrated circuit structure includes forming a dielectric layer; forming an opening in the dielectric layer; performing a first deposition step to form a seed layer in a first chamber; and performing a first etch step to remove a portion of the seed layer. The method may further include performing a second deposition step to increase the thickness of the seed layer. At least one of the first etch step and the second deposition step is performed in a second chamber different from the first chamber.

19 Claims, 7 Drawing Sheets

MULTI-STEP CU SEED LAYER FORMATION FOR IMPROVING SIDEWALL COVERAGE

CROSS-REFERENCE TO RELATED APPLICATION

This application is related to commonly assigned U.S. Patent Application Serial No. 12/031,108, filed Feb. 14, 2008, and entitled "In Situ Cu Seed Layer Formation for Improving Sidewall Coverage," which application is incorporated herein by reference.

TECHNICAL FIELD

This invention is related generally to integrated circuits, and more particularly to structures and formation methods of interconnect structures, and even more particularly to the improvement in the sidewall coverage of seed layers of metal lines.

BACKGROUND

In integrated circuit art, a commonly used method for forming metal lines and vias is known as "damascene." Generally, this method involves forming an opening in a dielectric layer, which separates the vertically spaced metallization layers. The opening is typically formed using conventional lithographic and etching techniques. After the formation, the opening is filled with copper or copper alloys. Excess copper on the surface of the dielectric layer is then removed by a chemical mechanical polish (CMP). The remaining copper or copper alloy forms vias and/or metal lines.

Copper is commonly used in the damascene structures because of its low resistivity. Typically, copper is electro plated into damascene openings. As is well known in the art, in order to plate copper, a seed layer is required to provide a low-resistance electrical path, and hence to enable uniform electro-plating over the wafer surface, so that copper ions in the plating solution can be deposited.

FIG. 1 illustrates a cross-sectional view of an intermediate stage in the formation of a conventional damascene structure. Trench opening 10 is formed in low-k dielectric layer 2, followed by the blanket formation of diffusion barrier layer 4. Next, copper seed layer 6 (including portions $6_1$, $6_2$, $6_{3\_1}$, and $6_{3\_2}$) is formed, either by physical vapor deposition (PVD), or by electroless plating. FIG. 1 illustrates a typical profile of seed layer 6 formed of PVD. Due to the fact that copper atoms are deposited downwardly, horizontal seed layer portions $6_1$ and $6_2$, which are over low-k dielectric layer 2 and in trench opening 10, respectively, are much thicker than portions $6_{3\_1}$ and $6_{3\_2}$ on sidewalls of trench opening 10. Furthermore, a necking effect often occurs, so that on the sidewalls of trench opening 10, top portions $6_{3\_1}$ of seed layer 6 are thicker than bottom portions $6_{3\_2}$, resulting in overhangs. The non-uniformity in the profile of seed layer 6 will adversely affect the quality of the subsequently performed electro plating.

Besides the adverse profile of seed layer 6 in the trench openings, asymmetry effects also result, and the asymmetry effects depend on the relative position of the trench opening on a wafer. For example, for a trench opening located close to an edge of a wafer, the side of the trench opening closer to the center of the wafer and the side closer to the edge of the wafer may have significantly different sidewall seed layer thicknesses. Also, overhangs of seed layers are more severe at the center portion of the wafer than at the edge portions. Further, the thickness of sidewall seed layer closer to the edge of the wafer is often less then those closer to the center of the wafer. All these asymmetry effects adversely affect the performance and reliability of the resulting interconnect structure.

One of the methods for reducing the above-discussed non-uniformity in a seed layer profile is to reduce the deposition rate of seed layer 6, for example, using very small power and/or adopting very low pressure in the process chamber. As a result, the throughput becomes very low, and hence this method is not suitable for mass production. New methods for improving the uniformity of seed layers without sacrificing the throughput are thus needed.

SUMMARY OF THE INVENTION

In accordance with one aspect of the present invention, a method of forming an integrated circuit structure includes forming a dielectric layer; forming an opening in the dielectric layer; performing a first deposition step to form a seed layer in a first chamber; and performing a first etch step to remove a portion of the seed layer. The method may further include performing a second deposition step to increase the thickness of the seed layer. At least one of the first etch step and the second deposition step is performed in a second chamber different from the first chamber.

In accordance with another aspect of the present invention, a method of forming an integrated circuit structure includes providing a semiconductor substrate; forming a dielectric layer over the semiconductor substrate; forming an opening in the dielectric layer; blanket forming a diffusion barrier layer, wherein the diffusion barrier layer extends into the opening; and performing a deposition-etch cycle. The deposition-etch cycle includes performing a first deposition step to form a seed layer on the diffusion barrier layer; and in-situ performing a first etch step to reduce a thickness of the seed layer. The method further includes, after the first etch step, performing a second deposition step to increase the thickness of the seed layer; and performing an electro plating to form a metallic material on the seed layer, wherein the metallic material fills the opening. At least one of the first etch step and the second deposition step is performed in a different chamber than the first deposition step In accordance with yet another aspect of the present invention, a method of forming an integrated circuit structure includes providing a semiconductor substrate; forming a dielectric layer over the semiconductor substrate; forming an opening in the dielectric layer; blanket forming a diffusion barrier layer, wherein the diffusion barrier layer extends into the opening; and performing a first deposition-etch cycle in a first chamber. The first deposition-etch cycle includes performing a first deposition step to form a seed layer on the diffusion barrier layer; and performing a first etch step to reduce a thickness of the seed layer. The method further includes performing a second deposition-etch cycle including performing a second deposition step to increase the thickness of the seed layer; and performing a second etch step to reduce the thickness of the seed layer. The method further includes performing an electro plating to form a metallic material on the seed layer, wherein the metallic material fills the opening. The second deposition-etch cycle is performed in a second chamber different from the first chamber.

An advantageous feature of the present invention includes improved conformity of seed layers, and hence improved quality of the resulting metal lines.

BRIEF DESCRIPTION OF THE DRAWINGS

For a more complete understanding of the present invention, and the advantages thereof, reference is now made to the following descriptions taken in conjunction with the accompanying drawings, in which.

DETAILED DESCRIPTION OF ILLUSTRATIVE EMBODIMENTS

The making and using of the presently preferred embodiments are discussed in detail below. It should be appreciated, however, that the present invention provides many applicable inventive concepts that can be embodied in a wide variety of specific contexts. The specific embodiments discussed are merely illustrative of specific ways to make and use the invention, and do not limit the scope of the invention.

Methods for forming metal lines with seed layers having improved sidewall coverage are provided. The intermediate stages of manufacturing embodiments of the present invention are illustrated. Throughout various views and illustrative embodiments of the present invention, like reference numbers are used to designate like elements.

Figure 1:
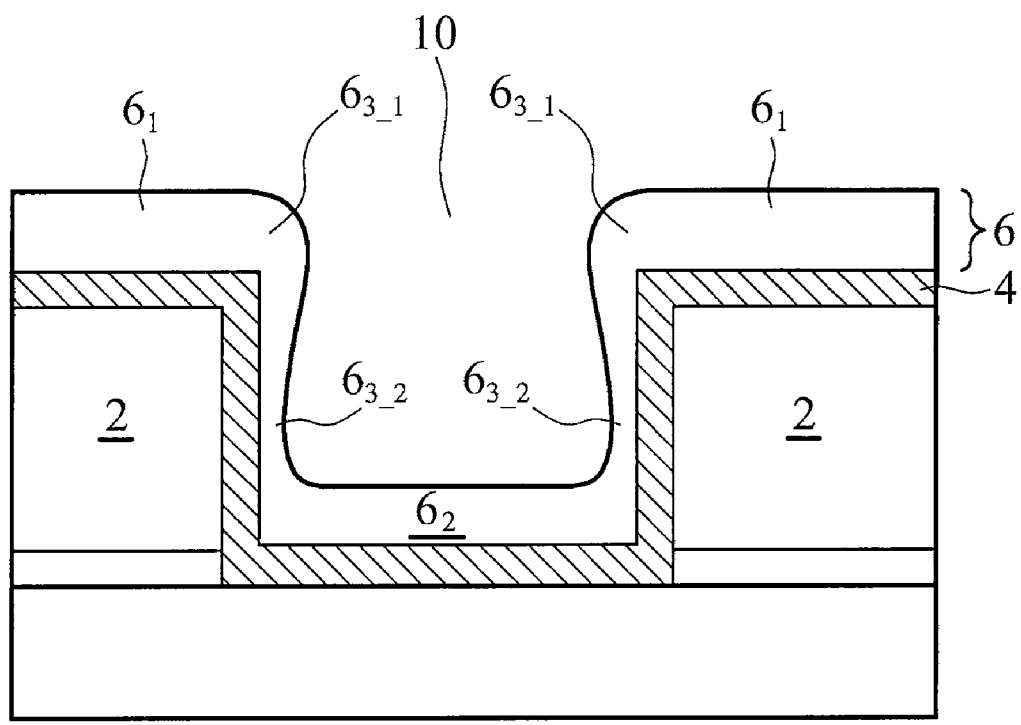
FIG. 1 illustrates a cross-sectional view of an intermediate stage in the formation of a conventional damascene structure, which includes a non-conforming seed layer.
Figure 2:
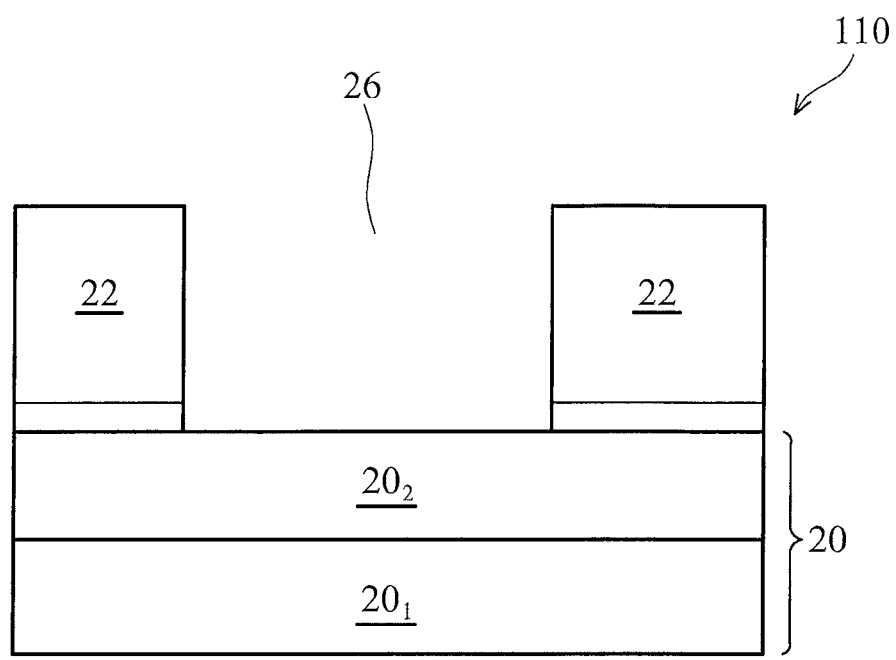
FIGS. 2 through 3 and FIGS. 5 through 9 are cross-sectional views of intermediate stages in the manufacturing of an interconnect structure.

Referring to FIG. 2, wafer 110 is provided, which includes schematically illustrated base structure 20, and dielectric layer 22 over base structure 20. Base structure 20 may include a semiconductor substrate, referred to herein as $20_1$, and overlying layers $20_2$, which may include a contact etch stop layer (ESL), an inter-layer dielectric (ILD), and inter-metal dielectrics (IMD), in which metallization layers (not shown) are formed. Semiconductor substrate $20_1$ may be a single crystalline or a compound semiconductor substrate. Active and passive devices (not shown), such as transistors, resistors, and inductors, may be formed on semiconductor substrate $20_1$. Opening 26 is formed in dielectric layer 22. In an exemplary embodiment, opening 26 is a trench opening for forming a metal line, and preferably has a width of less than about 90 nm. Alternatively, opening 26 may be a via opening, a contact opening, or the like.

In an exemplary embodiment, dielectric layer 22 has a low dielectric constant (k value), preferably lower than about 3.5, hence is referred to as low-k dielectric layer 22 throughout the description. More preferably, low-k dielectric layer 22 has a k value of less than about 2.8, and hence is sometimes referred to as an extra low-k (ELK) dielectric layer. Low-k dielectric layer 22 may include commonly used materials such as fluorinated silicate glass (FSG), carbon-containing dielectric materials, and may further contain nitrogen, hydrogen, oxygen, and combinations thereof. A porous structure may exist in low-k dielectric layer 22 for lowering its k value. The thickness of low-k dielectric layer 22 may be between about 100 Å and about 1 μm. One skilled in the art will realize, however, that the dimensions recited throughout the description are related to the technology used for forming the integrated circuits, and may be scaled to suit the scale of the forming technology. Low-k dielectric layer 22 may be formed using chemical vapor deposition, spin-on, or other commonly used methods.

Figure 3:
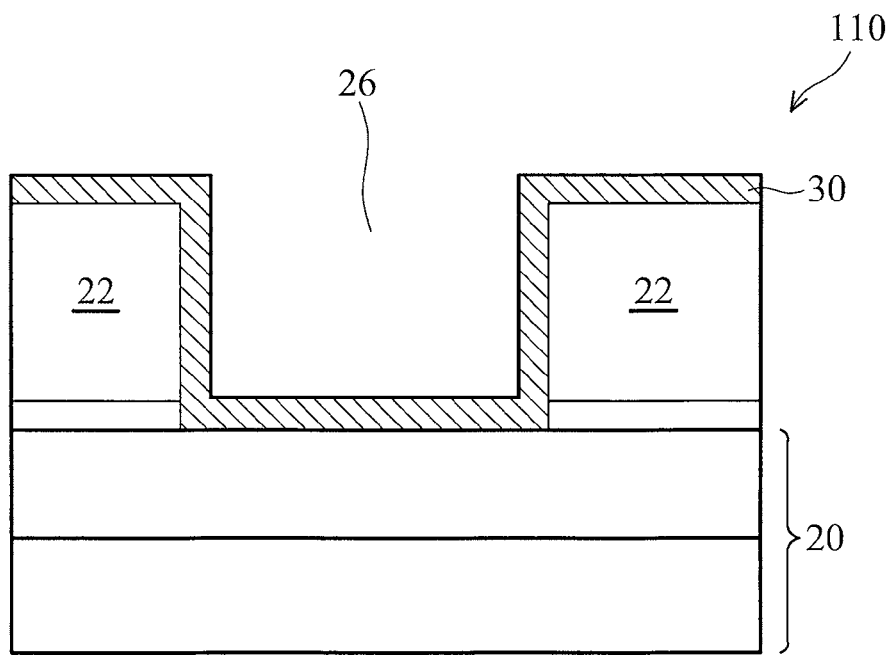

FIG. 3 illustrates the formation of (diffusion) barrier layer 30. Barrier layer 30 preferably includes titanium, titanium nitride, tantalum, tantalum nitride, or other alternatives, and may be formed using physical vapor deposition (PVD) or one of the commonly used chemical vapor deposition (CVD) methods. The thickness of barrier layer 30 may be between about 20 Å and about 200 Å.

Figure 4:
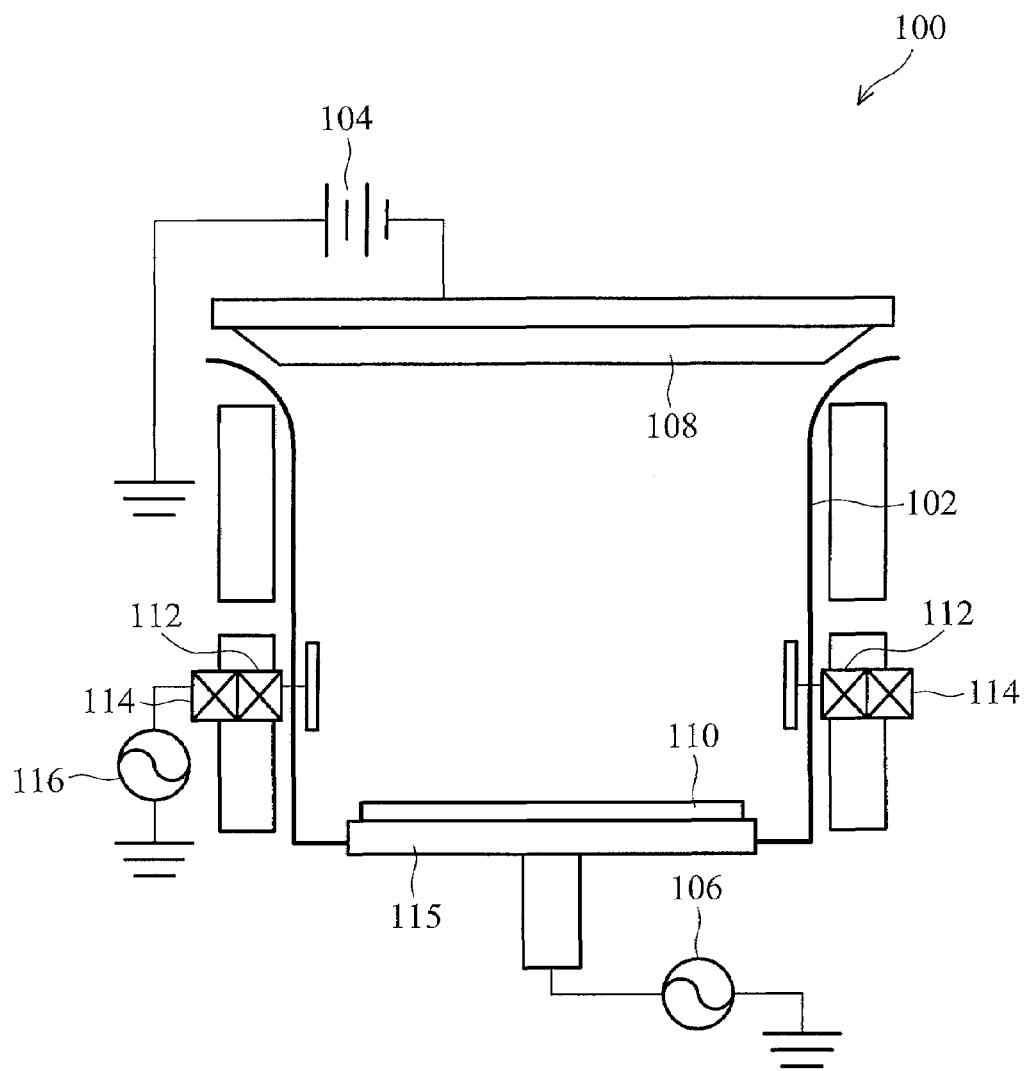
FIG. 4 illustrates a production tool for forming a seed layer in the formation of an interconnect structure.

Next, a seed layer is formed on barrier layer 30. FIG. 4 illustrates production tool 100 for forming the seed layer. Production tool 100 includes chamber 102 and power source 104 connected into chamber 102. Target 108 and wafer 110 are preferably placed facing each other. Target 108 is formed of the desirable materials for forming the seed layer. Preferably, target 108 includes copper or a copper alloy, which may include aluminum as an alloying material. Alternatively, target 108 may be formed of other metals such as ruthenium or a ruthenium alloy. Wafer 110 is preferably held by electrostatic chuck (ESC) 115, which provides electrostatic charges clamping wafer 110 to itself without mechanical fasteners. Power source 106 is connected to ESC 115, wherein power source 106 may be a radio frequency (RF) power source or a DC power source.

RF coil 112 is wrapped around the region directly over wafer 110, which region is preferably in a close proximity to wafer 110. RF power source 116 is connected to RF coil 112, which is used to generate and/or improve the ionization of argon and copper ions. In an exemplary embodiment, power source 116 applies a RF power having a frequency of 2 MHz. Electromagnets 114, often referred to as bottom inside magnet (BIM) and/or bottom outside magnet (BOM), are deployed surrounding the region directly over wafer 110. Preferably, BIM/BOM 114 is also in proximity to wafer 110, and may be wrapped around RF coil 112. BIM/BOM 114 helps to improve the uniformity in the deposition and/or etching processes.

Power sources 104 and 106 may be operated independently from each other. Each of the power sources 104 and 106 may be independently powered on and off without affecting the other. Preferably, the connection of each of the power sources 104 and 106 may be switched in polarity to either cause a deposition on wafer 110, or cause an etching on wafer 110. As one skilled in art will realize, whether a power source performs a deposition function or an etching function is determined by how the power source is connected, and to which of the target side or the wafer side it is connected to. In an exemplary embodiment, a DC power source is connected to target 108 side, and a RF power source is connected to wafer 110 side. Alternatively, the RF power source 106 may be connected to target 108 side, while the DC power source 104 may be connected to wafer 110 side. Power sources 104 and 106 may also be replaced by other power sources for bias sputter, magnetron sputter, ion metal plasma (IMP) sputter, and the like, and may be connected in different combinations. For the purpose of simplifying the following discussions, the exemplary power source 104 is referred to as a DC power source, and the exemplary power source 106 is referred to as a RF power source. Further, it is assumed the DC power source 104 has its negative end connected to the target 108 side, as is shown in FIG. 4, and hence DC power 104 performs the deposition function. Accordingly, RF power source 106 may perform the etching function.

Figure 5:
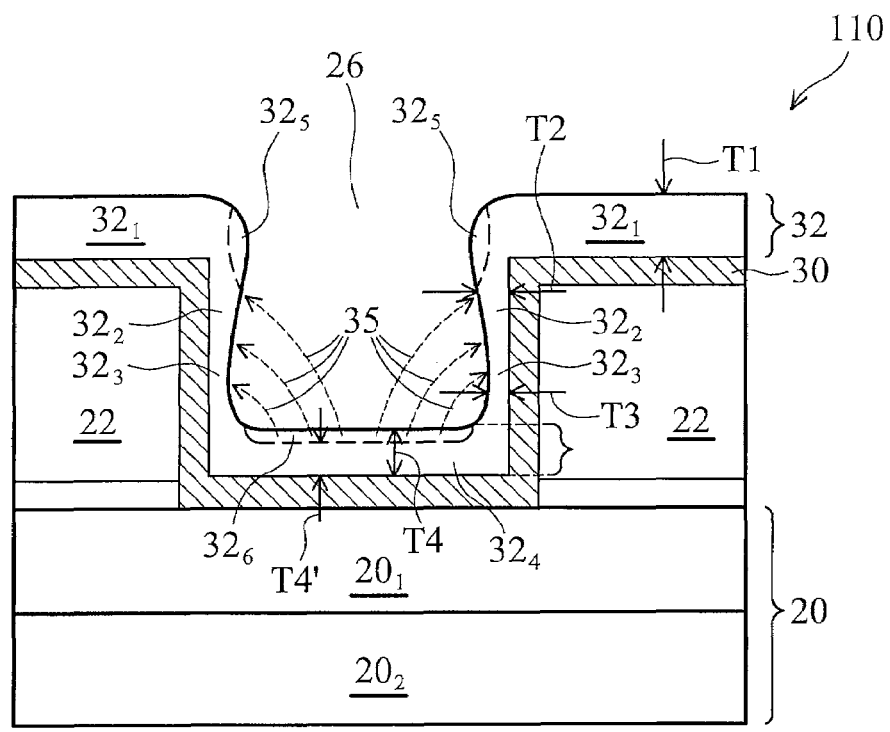

Using production tool 100 as illustrated in FIG. 4, seed layer 32 is formed on diffusion barrier layer 30, as is shown in FIG. 5. Optionally, before the formation of seed layer 32, barrier layer 30 is pre-cleaned, which may be performed in a production tool similar to the one shown in FIG. 4, except power source 104 is not turned on. In this case, RF power source 106 causes a light etch of the top surface of barrier layer 30. Alternatively, the pre-clean is performed in a separate chamber other than chamber 102. The pre-clean advantageously improves the surface texture of barrier layer 30, so that the subsequently formed seed layer 32 may be more conformal.

Next, a deposition step is performed, mainly caused by power source 104. In an exemplary deposition process, argon is first introduced into chamber 102 with a low pressure. DC power source 104 is turned on to ionize argon, generating argon plasma. The positively charged argon ions are attracted to the negatively charged target 108, causing a bombardment of target 108. Copper ions are thus sputtered from target 108, and deposited onto wafer 110, forming seed layer 32. After the argon plasma is started, the argon flowing into chamber 102 may be turned off. Seed layer 32 may have a thickness of between about 200 Å and about 1200 Å. In an exemplary embodiment, the power of DC power source 106 is between about 20 KW and about 60 KW, and an exemplary thickness T1 of a portion of seed layer directly over low-k dielectric layer 22 is about 300 Å.

Seed layer 32 includes portions $32_1$ directly on low-k dielectric layer 22, portions $32_2$ on sidewalls of, and close to, the top of opening 26, portions $32_3$ on sidewalls of, and close to, the bottom of opening 26, and portion $32_4$ at the bottom of opening 26. If seed layer 32 is formed by turning RF power source 106 off, the resulting seed layer 32 is typically highly non-conformal (with poor sidewall coverage) with different portions of seed layer 32 have significantly different thicknesses. For example, thicknesses T1 and T4 of respective horizontal portions $32_1$ and $32_4$ will be significantly greater than thicknesses T2 and T3 of respective sidewall portions $32_2$ and $32_3$. Thickness T2 of portion $32_2$ is also typically greater than thickness T3 of portion $32_3$. The excess portions $32_2$ hanging beyond portions $32_3$ are often referred to as overhangs.

During the deposition of seed layer 32, power 116 may be turned on to improve the direction of ions. Further, RF power 106 may be turned on to further increase the re-sputtering rate. In this case, DC power 104 outputs a power greater than that of RF power 106, and hence the net effect is deposition.

Figure 6:
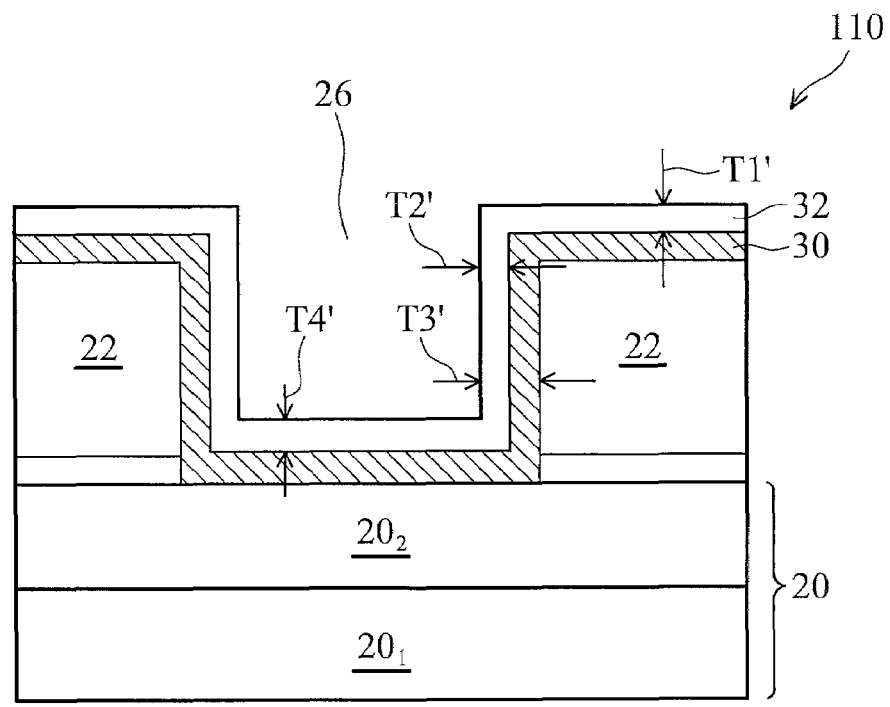

Although the re-sputtering in the deposition step has the effect of improving the sidewall coverage (and the conformity) of seed layer 32. The resulting conformity may still not be satisfactory. In the resulting structure (refer to FIG. 5), thicknesses T1 and T4 may still be greater than thicknesses T2 and T3, and thickness T2 may still be greater than thickness T3. An etch step is thus performed, resulting in a structure schematically shown in FIG. 6.

In an embodiment, the etch step is performed by turning off the power of DC power source 104, and turning on the power of RF power source 106. In alternative embodiments, the etch step may be performed by connecting the positive end of DC power 104 to target 108. In yet other embodiments, the etch step may be performed by using a similar production tool for the pre-clean process. In an exemplary embodiment, the power of RF power source 106 is between about 0.2 KW and about 1 KW, and the power of RF power source 116 is between about 1 KW and about 2 KW.

Referring back to FIG. 5, the etch step may result in three possible effects; the thicknesses T1 and T4 of seed layer 32 are reduced; the overhangs $32_5$ are sputtered away; and a top layer $32_6$ of bottom seed layer $32_4$ is re-sputtered onto portions $32_3$ and possibly portions $32_2$, as schematically illustrated by arrows 35. These three effects in combination generate a net effect of thinning thicker portions and thickening thinner portions of seed layer 32. As a result, seed layer 32 has an improved conformity.

The deposition step and the etch step discussed in the preceding paragraphs in combination are referred to as a deposition-etch cycle. After the first deposition-etch cycle, a second deposition step may be performed, which may further be followed by a second etch step. The deposition-etch cycles may be repeated. Preferably, for each of the additional deposition-etch cycles, the thicknesses T1' and T4' are increased over the preceding deposition-etch cycle. Alternatively, an additional deposition-etch cycle may result in the reduction in thicknesses T1' and T4' over the preceding deposition-etch cycle. However, each additional deposition-etch cycle will cause the increase in the thickness T3', and hence results in a more conformal seed layer 32. The repetition of the deposition-etch cycles eventually results in substantially equal thicknesses T1', T2', T3', and T4'. Advantageously, by dividing one deposition-etch cycle into a plurality of deposition-etch cycles, the profile of seed layer 32 may be fixed before excess non-uniformity is resulted.

With more seed layer 32 etched, seed layer 32 is more conformal. However, care needs to be taken to ensure that the bottom seed layer portion $32_4$ is not etched through. Preferably, after the etch step, a ratio of thickness T4' to thickness T4, which reflects how much percentage of seed layer 32 is removed in the etch step, is less than about 50%, and more preferably less than about 30%. In an exemplary embodiment, after the etch step, thickness T1' is about 150 Å. Although with a smaller T4'/T4 ratio, the profile of seed layer 32 is more conformal, more deposition-etch cycles are needed to achieve desirable thickness T4'.

Optionally, after all deposition-etch cycles are performed, a flash deposition step is performed to conclude the formation of seed layer 32, for example, using essentially the same production tool and power setting as the deposition steps discussed in the preceding paragraphs. However, the flash deposition step is only performed briefly, and the resulting seed layer 32 may be increased in thickness by only about 100 Å to about 200 Å. The flash deposition may replenish seed layer 32 in some corner regions, in case these corner regions are substantially etched-through in the preceding etch step.

With multiple deposition and etch steps, however, the production throughput may be significantly reduced, and the formation of seed layer 32 may become a bottleneck of the production. In addition, some production tools may be capable of performing only one of the deposition and etch steps, and hence the deposition-etch cycle may have to be accomplished in different chambers. Accordingly, more than one chamber may be used, and the respective formation of seed layer 32 is referred to as multi-step formation. In a first embodiment, the deposition step and the etch step are performed in two chambers, with one chamber performing the deposition step only, and the other chamber performing the etch step only. In this case, the production tools only need one of the power sources 104 and 106, depending on the task to perform. In alternative embodiments, a deposition-etch cycle is performed in one chamber 102, while some other steps, which may include either a deposition step or a deposition-etch cycle, are performed in another chamber(s). With more deposition-etch cycles, more chambers may be added.

Figure 10:
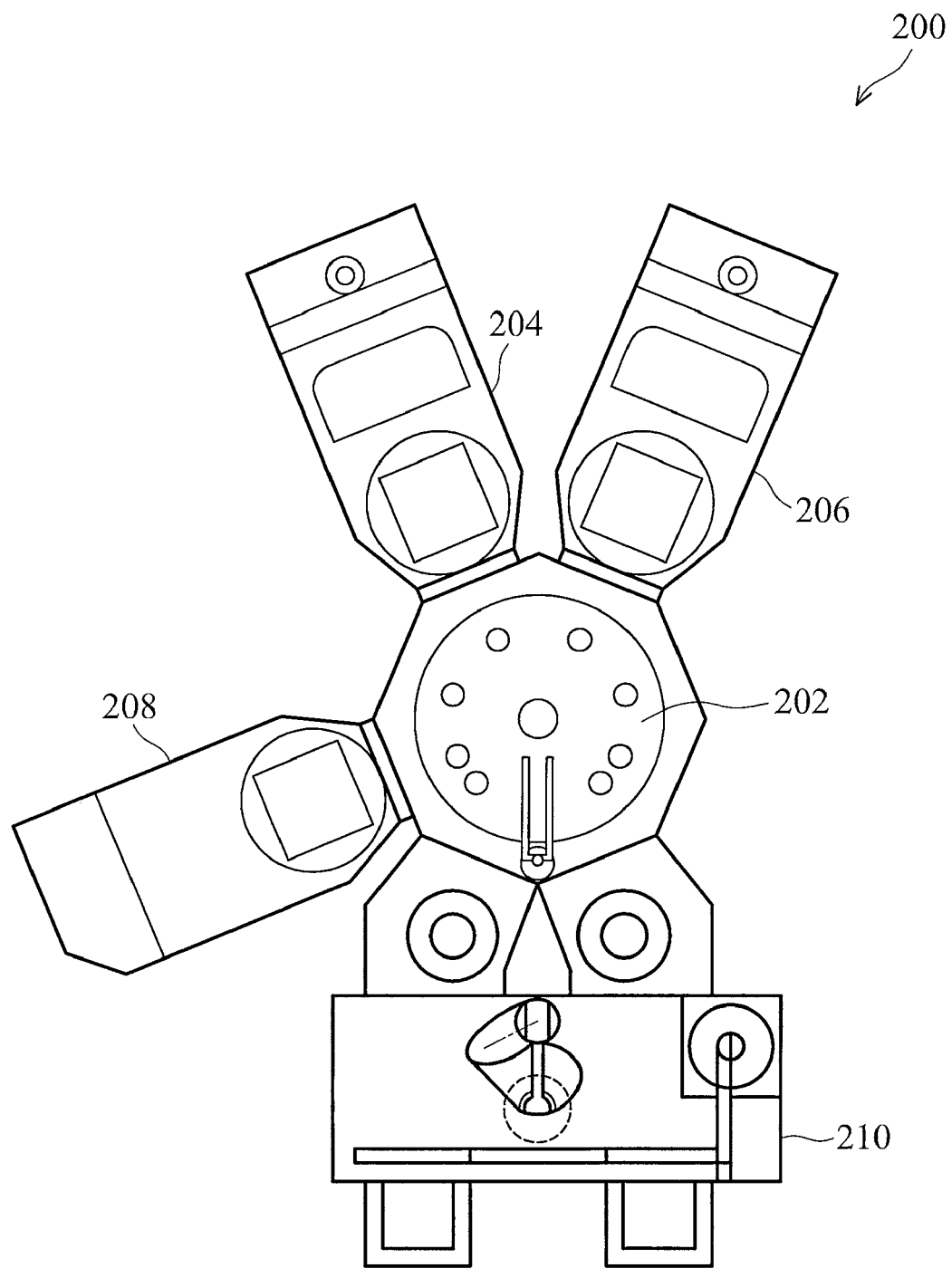
FIG. 10 illustrates a production tool including more than one chamber, wherein the production tool is used for the multi-step seed layer formation.

FIG. 10 illustrates an exemplary production tool 200 for performing multi-step formation of seed layer 32. Production tool 200 includes transfer chamber 202 for transferring wafers, and chambers 204, 206, and 208. Each of the chambers 204, 206 and 208 may be used to perform either one, or both, of the deposition and etch steps. After one of the steps is finished in one of the chambers 204, 206, and 208, the wafers may be transferred between chambers 204, 206 and 208 through transfer chamber 202. Production tool 200 further includes loadlock 210 for loading wafers into, and unloading the wafers from, transfer chamber 202. During the transferring, chambers 202, 204, 206, and 208 are preferably kept vacuumed. Accordingly, the multi-step seed layer formation may be performed with no vacuum break between any of the deposition and etch steps.

Figure 7:
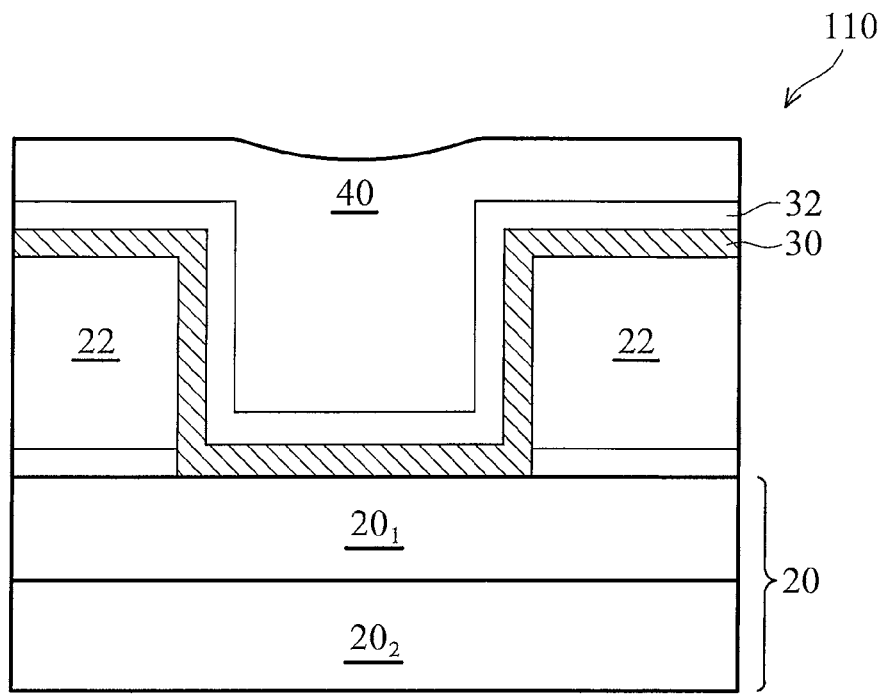

Next, as shown in FIG. 7, copper 40 is filled into the remaining portion of opening 26. In the preferred embodiment, copper 40 is formed using electro plating, wherein wafer 110 is submerged into a plating solution, which contains ionized copper. Due to improved uniformity of seed layer 32, voids are less likely to be formed in opening 26 (refer to FIG. 6).

Figure 8:
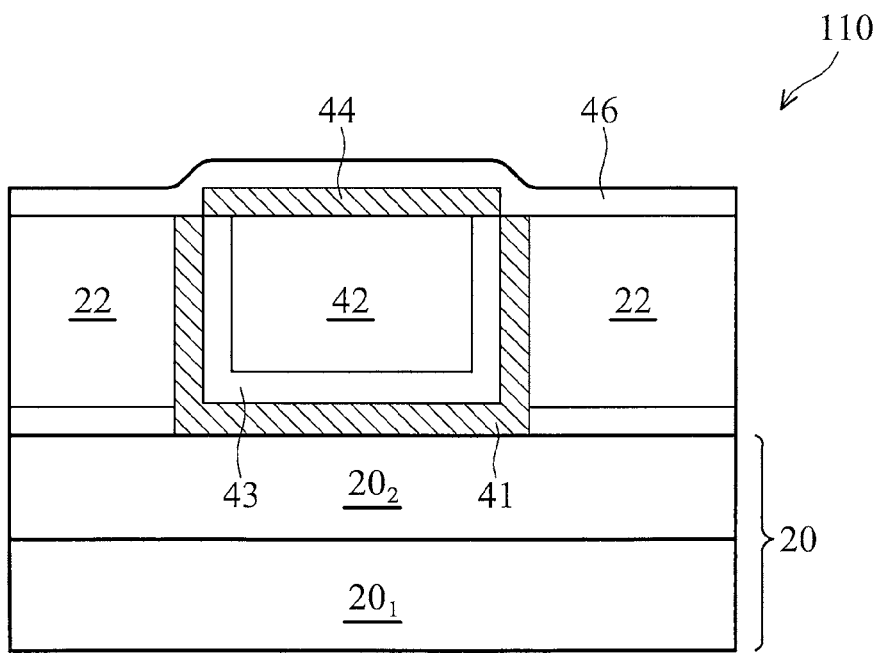

Referring to FIG. 8, a chemical mechanical polish (CMP) is performed to remove excess portions of copper 40, seed layer 32, and barrier layer 30 over low-k dielectric layer 22, leaving copper line 42 and portions of barrier layer 30 and seed layer 32 in opening 26. The remaining portion of barrier layer 30 and seed layer 32 are referred to as barrier layer 41 and seed layer 43, respectively.

FIG. 8 also illustrates the formation of metal cap 44 and etch stop layer (ESL) 46. Metal cap 44 may be formed of CoWP or other commonly used materials. ESL 46 may be formed of a dielectric material, preferably having a dielectric constant of greater than about 3.5, and may include materials such as silicon nitride, silicon carbide, silicon carbonitride, silicon carbon-oxide, $CH_x$, $CO_yH_x$, and combinations thereof. The details for forming metal cap 44 and ESL 46 are well known in the art, and hence are not repeated herein.

Figure 9:
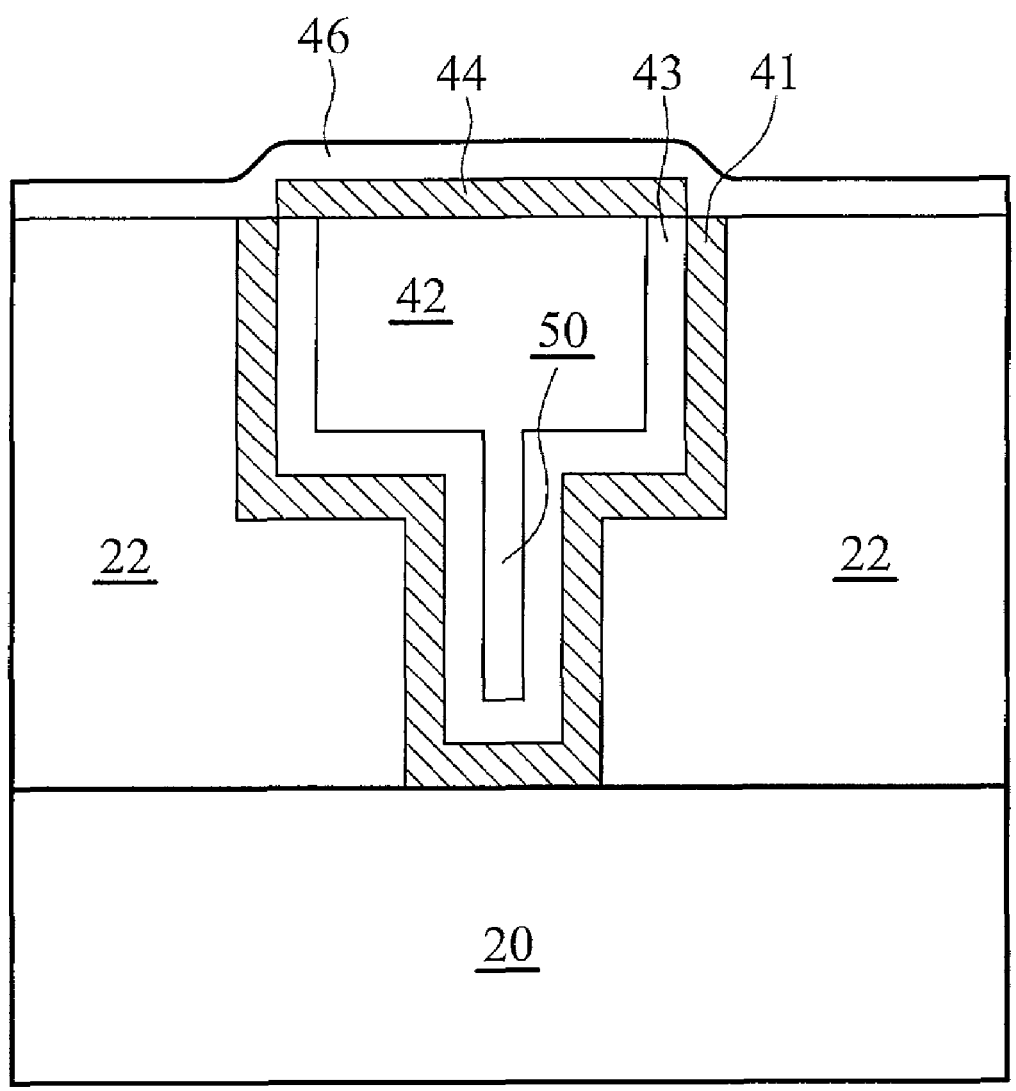

The teaching provided in the preceding paragraphs is readily applicable for use in dual damascene processes. FIG. 9 illustrates a dual damascene structure, which includes barrier layer 41 and seed layer 43. Seed layer 43 is formed using essentially the same method as taught in preceding paragraphs. Copper line 42 and via 50 are filled in the opening, preferably by electro plating. Similar to the single damascene process, by applying the teaching of the present invention into the formation of seed layer 43, seed layer 43 also has improved conformity, and hence the quality of metal line 42 and via 50 is improved.

The embodiments of the present invention have several advantageous features. By incurring re-sputtering in the deposition steps, the conformity of the resulting seed layers is significantly improved. The subsequent etch steps further improve the conformity of the resulting seed layers. The resulting seed layers are substantially overhang-free. The asymmetry between metal lines in the center portions and metal lines in the edge portions of wafer is also reduced. Furthermore, the seed layers may be formed using more than one chamber, and hence the throughput of the manufacturing process is not affected.

Although the present invention and its advantages have been described in detail, it should be understood that various changes, substitutions and alterations can be made herein without departing from the spirit and scope of the invention as defined by the appended claims. Moreover, the scope of the present application is not intended to be limited to the particular embodiments of the process, machine, manufacture, and composition of matter, means, methods steps described in the specification. As one of ordinary skill in the art will readily appreciate from the disclosure of the present invention, processes, machines, manufacture, compositions of matter, means, methods, or steps, presently existing or later to be developed, that perform substantially the same function or achieve substantially the same result as the corresponding embodiments described herein may be utilized according to the present invention. Accordingly, the appended claims are intended to include within their scope such processes, machines, manufacture, compositions of matter, means, methods, or steps.

What is claimed is:

1. A method of forming an integrated circuit structure comprising:
   forming a dielectric layer over a semiconductor substrate;
   forming an opening in the dielectric layer;
   performing a first deposition step to form a seed layer in a first chamber, wherein the seed layer comprises a first portion in the opening, and a second portion over the dielectric layer; and
   performing a first etch step to remove a portion of the seed layer in a second chamber different from the first chamber, wherein the first chamber and the second chamber are vacuum chambers.

2. The method of forming the integrated circuit structure according to claim 1, wherein the first deposition step and the first etch step are performed with no vacuum break therebetween.

3. The method of forming the integrated circuit structure according to claim 1, further comprising performing a second deposition step in one of the first and the second chambers.

4. The method of forming the integrated circuit structure according to claim 3, further comprising, after the second deposition step, performing a second etch step in one of the first and the second chambers.

5. The method of forming the integrated circuit structure according to claim 1, wherein the first deposition step comprises a simultaneous re-sputtering.

6. The method of forming the integrated circuit structure according to claim 1, wherein the first etch step comprises applying a RF power to a RF coil, and wherein the RF coil is wrapped horizontally around a region directly over the integrated circuit structure, and applying an additional RF power to incur etching.

7. The method of forming the integrated circuit structure according to claim 1, wherein the first etch step comprises sputtering a top layer from the first portion of the seed layer, and wherein a bottom layer directly underlying the top layer is not sputtered.

8. A method of forming an integrated circuit structure comprising:
   forming a dielectric layer over a semiconductor substrate;
   forming an opening in the dielectric layer;
   performing a first deposition step to form a seed layer in a first chamber;
   performing a second deposition step in one of the first and a second chamber; and
   performing an etch step in one of the first and the second chambers, wherein the second deposition step and the etch step in combination result in a decrease in a thickness of a bottom portion of the seed layer at a bottom of the opening.

9. A method of forming an integrated circuit structure comprising:
   providing a semiconductor substrate;
   forming a dielectric layer over the semiconductor substrate;
   forming an opening in the dielectric layer;

blanket forming a diffusion barrier layer, wherein the diffusion barrier layer extends into the opening;
performing a deposition-etch cycle comprising:
   performing a first deposition step to form a seed layer on the diffusion barrier layer, wherein the first deposition step is performed; and
   in-situ performing a first etch step to reduce a thickness of the seed layer;
after the first etch step, performing a second deposition step to increase the thickness of the seed layer, wherein at least one of the first etch step and the second deposition step is performed in a different chamber than the first deposition step; and
performing an electro plating to form a metallic material on the seed layer, wherein the metallic material fills the opening.

10. The method of forming the integrated circuit structure according to claim 9, wherein the first deposition step is performed using a first power source to generate a deposition effect, and wherein the first etch step is performed using a second power source to generate an etch effect.

11. The method of forming the integrated circuit structure according to claim 10, further comprising, before the deposition-etch cycle, turning on the second power source and turning off the first power source to perform a pre-clean on a surface of the diffusion barrier layer.

12. The method of forming the integrated circuit structure according to claim 9, wherein the first etch step comprises:
   applying a RF power to a RF coil around a region directly over the semiconductor substrate, and applying an additional RF power to an electrostatic chuck underlying the semiconductor substrate.

13. The method of forming the integrated circuit structure according to claim 9, further comprising a second etch step after the second deposition step.

14. The method of forming the integrated circuit structure according to claim 9, further comprising, after the step of electro plating, performing a flash deposition.

15. The method of forming the integrated circuit structure according to claim 9, wherein the first etch step comprises sputtering a top layer of the seed layer from inside the opening, and wherein a bottom layer directly underlying the top layer is not sputtered.

16. A method of forming an integrated circuit structure comprising:
   providing a semiconductor substrate;
   forming a dielectric layer over the semiconductor substrate;
   forming an opening in the dielectric layer;
   blanket forming a diffusion barrier layer, wherein the diffusion barrier layer extends into the opening;
   performing a first deposition-etch cycle in a first chamber, the first deposition-etch cycle comprising:
      performing a first deposition step to form a seed layer on the diffusion barrier layer; and
      performing a first etch step to reduce a thickness of the seed layer;
   performing a second deposition-etch cycle comprising:
      performing a second deposition step to increase the thickness of the seed layer; and
      performing a second etch step to reduce the thickness of the seed layer, wherein the second deposition-etch cycle is performed in a second chamber different from the first chamber; and
   performing an electro plating to form a metallic material on the seed layer, wherein the metallic material fills the opening.

17. The method of forming the integrated circuit structure according to claim 16, wherein the first and the second deposition-etch cycles are performed with no vacuum break therebetween.

18. The method of forming the integrated circuit structure according to claim 16, wherein the second deposition-etch cycle results in an increase in a bottom thickness of the seed layer.

19. The method of forming the integrated circuit structure according to claim 16, wherein the second deposition-etch cycle results in a decrease in a bottom thickness of the seed layer.

* * * * *